United States Patent
Min et al.

(10) Patent No.: US 9,281,468 B2
(45) Date of Patent: Mar. 8, 2016

(54) MAGNETIC MEMORY ELEMENT

(71) Applicant: IMEC, Leuven (BE)

(72) Inventors: Tai Min, Wilsele (BE); Taiebeh Tahmasebi, Heverlee (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/307,144

(22) Filed: Jun. 17, 2014

(65) Prior Publication Data

US 2015/0008550 A1 Jan. 8, 2015

(30) Foreign Application Priority Data

Jun. 17, 2013 (EP) ..................... 13172259

(51) Int. Cl.
| | |
|---|---|
| *H01L 43/02* | (2006.01) |
| *H01L 43/10* | (2006.01) |
| *H01F 10/32* | (2006.01) |
| *H01L 43/08* | (2006.01) |

(52) U.S. Cl.
CPC .............. *H01L 43/10* (2013.01); *H01F 10/32* (2013.01); *H01L 43/08* (2013.01)

(58) Field of Classification Search
USPC ....................................... 257/421
See application file for complete search history.

(56) References Cited

U.S. PATENT DOCUMENTS

| | | | | |
|---|---|---|---|---|
| 6,641,935 | B1 * | 11/2003 | Li | G11B 5/66 428/336 |
| 6,731,477 | B2 * | 5/2004 | Lin | B82Y 10/00 360/324.1 |
| 6,743,503 | B1 | 6/2004 | Chen | |
| 2012/0028373 | A1 * | 2/2012 | Belen | H01L 43/12 438/3 |
| 2012/0286382 | A1 * | 11/2012 | Jan | G01R 33/098 257/421 |
| 2012/0295132 | A1 | 11/2012 | Min et al. | |
| 2012/0299134 | A1 * | 11/2012 | Jan | H01L 43/08 257/421 |
| 2013/0270523 | A1 * | 10/2013 | Wang | H01L 43/10 257/30 |
| 2014/0319634 | A1 * | 10/2014 | Shukh | H01L 27/224 257/427 |
| 2015/0008550 | A1 * | 1/2015 | Min | H01F 10/32 257/421 |

OTHER PUBLICATIONS

Ikeda et al., "A perpendicular-anisotropy CoFeB—MgO magnetic tunnel junction," *Nature Materials Letters*, vol. 9, pp. 721 (Sep. 2010).

Worledge et al. "Spin torque switching of perpendicular Ta_CoFeB_MgO-based magnetic tunnel junctions," Applied Physics Letters, vol. 98, pp. 022501 (2011).

* cited by examiner

*Primary Examiner* — Thao P Le
(74) *Attorney, Agent, or Firm* — Knobbe, Martens, Olson & Bear LLP (57) ABSTRACT

The disclosed technology generally relates to semiconductor devices, and more particularly spin transfer torque magnetic random access memory (STTMRAM) elements having perpendicular magnetic anisotropy (PMA). In one aspect, a magnetic element comprises a metal underlayer and a seed layer on the underlayer, the seed layer comprising alternating layers of a first metal and a second metal. The alternating layers of a first metal and a second metal are repeated n times with, $2 \leq n \leq 20$. Also a spin transfer torque magnetic random access memory element is disclosed having a perpendicular magnetic orientation comprising a metal underlayer on a substrate, a seed layer on the metal underlayer; the seed layer comprising alternating layers of a first metal and a second metal, a magnetic tunnel junction (MTJ) element with a perpendicular orientation including: a reference layer formed on the seed layer, a tunnel barrier layer formed on the reference layer, a storage layer formed on the tunnel barrier layer and a top electrode and a bottom electrode.

15 Claims, 6 Drawing Sheets

MAGNETIC MEMORY ELEMENT

CROSS-REFERENCE TO RELATED APPLICATIONS

This application claims foreign priority to European patent application EP 13172259.7 filed on Jun. 17, 2013, the content of which is incorporated by reference herein in its entirety.

BACKGROUND OF THE INVENTION

1. Field of the Invention

The disclosed technology generally relates to semiconductor devices, and more particularly to spin transfer torque magnetic random access memory (STTMRAM) elements having perpendicular magnetic anisotropy (PMA).

2. Description of the Related Technology

Magnetic random access memory (MRAM) is emerging as an alternative to conventional semiconductor memories such as SRAM, DRAM and/or flash memory. Compared to volatile memories such as SRAM and DRAM, MRAM can be advantageous because it can be non-volatile. Compared to non-volatile memories such as flash memory used for storage application, MRAM can be advantageous because it can offer high endurance (e.g., greater than $10^6$ cycles). It has been recognized that, in order to compete with flash memory as a non-volatile memory, there is a need to increase the density of MRAM cells in a chip, which involves keeping the MRAM cells as small as possible. It has also been recognized that, in order to compete with SRAM and DRAM as a volatile memory, there is a need to increase the speed of access without compromising the density.

As compared to field-switchable MRAM devices that were studied in the earlier part of the last decade, spin-torque transfer based MRAMs (STTMRAMs) have gained popularity in part due to their potential to be scaled to very small sizes. It has been recognized that scalability of STTMRAMs can be limited by thermal stability, as well as by writability. Two different geometries—one with magnetization in plane and another with magnetization out-of-plane (perpendicular)—have been proposed. It has been suggested that, while the former may be implemented at entry level, the latter may be more promising to be implemented as a more scalable geometry of the two different geometries of magnetic tunnel junction (MTJ) cells, especially from switching and thermal stability perspectives.

Some STTMRAM devices comprise a magnetic tunnel junction (MTJ) element, which includes a tunnel barrier layer sandwiched between a reference layer and a storage layer. Several material systems have been proposed and utilized. For example, a perpendicular MTJ stack structure such as CoFeB/MgO/CoFeB in which a single layer of CoFeB having perpendicular magnetic anisotropy (PMA) can be used in both storage layer and reference layer. This work was introduced by Tohoku university group and it was published with the title of "A perpendicular-anisotropy CoFeB—MgO magnetic tunnel junction" by S. Ikeda et al. in Nature Materials 9, page 721 (2010). This stack structure has been demonstrated for STTMRAM device application. Because it is based on the standard CoFeB—MgO structure, high tunnel magnetoresistance (TMR) signal, low switching current density ($J_c$) and appreciable PMA can be achieved simultaneously. In a first demonstrated CoFeB—MgO structure, switching fields of storage layer and reference layer are separated by slightly changing the CoFeB thickness. However, such stack design requires a thinner reference layer and results in less $J_c$ margin for reference layer switching.

In order to increase the stability of the reference layer, D. C. Worldege et al. proposed in Applied Physical Letters 98, 022501 (2011) using a synthetic antiferromagnetic (SAF) coupling structure in the hard layer, in which Co/Pd bilayers are used in the pinned layer. Although the hard layer stability was solved in their experiments, however, some more challenges were identified in their report. First, the Gilbert damping constant in the Pd or Pt in Co-based multilayer stack was high. This was due to a strong spin-orbit coupling between Pd and Pt with Co in such multilayers stack. Second, Pd or Pt in these Co-based multilayer stacks are known as challenging materials to integrate into CMOS processes, especially from etching point of view. Third, the maximum temperature which this material stack can withstand is not reported to be higher than 300° C. Consequently, this material stack cannot be implemented in real MTJ cells being used in STTMRAM devices.

There is thus a need for improvement in material compatibility with CMOS process technology, thermal stability and electrical properties of the STTMRAM device.

SUMMARY OF CERTAIN INVENTIVE ASPECTS

The disclosure is related to a magnetic memory device.

A first aspect relates to a magnetic element, the magnetic element comprising a metal underlayer and a seed layer on the underlayer, the seed layer comprising alternating layers of a first metal and a second metal.

According to embodiments, the alternating layers of a first metal and a second metal are repeated n times with $2<=n<=20$.

According to embodiments, the alternating layers have a thickness smaller than 0.3 nm.

According to embodiments, the alternating layers are alternating monolayers.

According to embodiments, the alternating layers of the seed layer form a superlattice structure.

According to embodiments, the seed layer comprises alternating monolayers of Ni and Cr.

According to embodiments, the metal underlayer comprises Hf, Ta or Ti.

According to embodiments, the magnetic element further comprises a reference layer on the seed layer; a tunnel barrier layer on the reference layer and a storage layer on the tunnel barrier layer.

According to embodiments, the seed layer is selected to promote a stronger perpendicular magnetic anisotropy of the reference layer.

According to embodiments, the reference layer comprises a multilayered stack of alternating metal layers on the seed layer and a polarizer layer on the multilayered stack.

According to embodiments, the multilayered stack of alternating metal layers of the reference layer comprises alternating layers of Co and Ni.

According to embodiments, the reference layer further comprises an insertion layer in between the multilayered stack and the polarizer layer.

According to embodiments the insertion layer comprises any of Ta, TaN, Ti, Hf or FeTa.

A second aspect relates to a spin transfer torque magnetic random access memory (STTMRAM) element having a perpendicular magnetic orientation comprising a metal underlayer on a substrate; a seed layer on the metal underlayer, the seed layer comprising alternating layers of a first metal and a second metal, a magnetic tunnel junction (MTJ) element with a perpendicular orientation including: a reference layer formed on the seed layer, a tunnel barrier layer formed on the reference layer, a storage layer formed on the tunnel barrier layer and a top electrode and a bottom electrode for electrically contacting opposite sides of the STTMRAM element.

According to embodiments, the STTMRAM element comprises a metal underlayer comprising Hf, Ta or Ti on a Si-based substrate; a seed layer on the metal underlayer, the seed layer comprising alternating monolayers of Ni and Cr, a magnetic tunnel junction (MTJ) element with a perpendicular orientation including: a reference layer formed on the seed layer; the reference layer comprising a multilayered stack of alternating layers of Ni and Co, an insertion layer of Ta, or TaN or Ti or Hf or FeTa on the multilayered stack and a polarizer layer of CoFeB on the insertion layer, a tunnel barrier layer formed on the reference layer comprising MgO; a storage layer formed on the tunnel barrier layer; the storage layer comprising CoFeB.

It is an advantage of the different embodiments of the present disclosure that by using a superlattice seed layer strong perpendicular magnetic anisotropy (PMA) is achieved for the reference layer.

It is an advantage of the MTJ stack according to the different embodiments of the present disclosure that it is compatible with back-end-of-line (BEOL) process.

It is an advantage of the MTJ stack according to the different embodiments of the present disclosure that it has increased thermal stability compared to prior art and can thus withstand subsequent (high temperature) annealing steps in the further processing of the MRAM device comprising the patterned MTJ stack. It is an advantage of the different embodiments of the present disclosure that the MTJ stack withstands an 400° C. annealing temperature for at least 2 hours in back-end-of-line (BEOL) process. It is an advantage of the MTJ stack according the different embodiments of the present disclosure that it will have a very high thermal stability; and therefore, the possibility of data retention could be at least for 10 years.

It is an advantage of the MTJ stack according to the different embodiments of the present disclosure performs high tunnel magnetoresistance (TMR) signal.

It is an advantage of the MTJ stack according the different embodiments of the present disclosure that it can reduce the total MTJ stack height and therefore, the present disclosure makes MTJ device fabrication easier.

It is an advantage of the different embodiments of the present disclosure that the structures integrate a hard magnetic layer into a perpendicular MTJ stack while maintaining PMA of the CoFeB—MgO system for high TMR, low $J_c$, higher thermal stability.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising," used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The disclosure will now be described by a detailed description of several embodiments of the disclosure.

The disclosure is related to a magnetic memory element comprising different layers. In the prior art different terms are often used for the different layers. A magnetic tunneling junction (MTJ) element typically comprises a tunnel barrier layer sandwiched between a reference layer and a storage layer. The reference layer is often also referred to as the fixed layer or the pinned layer or the hard magnetic layer. The free layer is often also referred to as the storage layer or the pinning layer or the soft magnetic layer.

Figure 1:
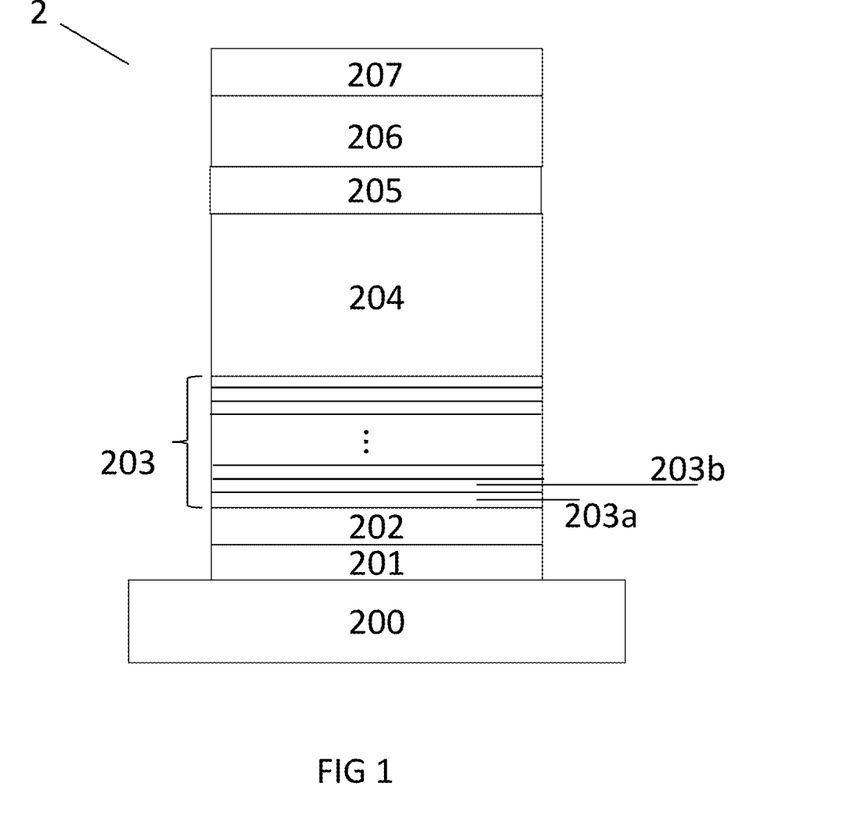
FIGS. 1-3 are schematic cross-sectional illustrations of a magnetic element according to various embodiments of the present disclosure.

FIG. 1 illustrates a magnetic element 2 according to some embodiments.

The magnetic element 2 comprises a semiconductor substrate 200, which may be, for example, a silicon-based semiconductor substrate.

The magnetic element 2 additionally comprises a bottom electrode 201, which can be formed of Ta, Ti, TaN, TiN, or a combination thereof, such as, for example, TaTi. The bottom electrode 201 can be formed of other conductive layers such as, for example, Cu.

The magnetic element 2 additionally comprises a metal underlayer 202 formed on the bottom electrode 201.

Advantageously, in some embodiments, the metal underlayer 202 provides adhesion between the bottom electrode 201 and a seed layer 203. Additionally, the underlayer 202 can enhance the desired crystallographic texture for both seed layer 203 (which is formed on the underlayer 202) and magnetic layer 204 (which is part of the magnetic element and formed on the seed layer 203). The underlayer 202 can also increase the PMA of the magnetic layer 204. The underlayer 202 together with the seed layer 203 promotes the good texture and good interface for magnetic layer 204 growth.

In the illustrated embodiment of the magnetic element 2 in FIG. 1, the magnetic layer 204 comprises Co/Ni multilayers. The underlayer 202 includes a metallic layer which includes a metal such as Hf, Ta, Ti, Zr, V, W, Cr, Ru, Cu or combinations thereof.

Still referring to FIG. 1, in some embodiments, the seed layer 203 is formed on the metal underlayer 202 and comprises a layer of first metal M1 and a layer of second metal M2. In some other embodiments, the seed layer 203 comprises multiple alternating layers 203a and 203b of the first metal M1 and the second metal M1, respectively. In yet some other embodiments, the seed layer 203 comprises a superlattice formed by alternating monolayers 203a and 203b of the first metal M1 and the second metal M2. It will be appreciated than the seed layer 203 may be terminated with either of the first metal M1 or the second metal M2.

As illustrated, the seed layer 203 advantageously comprises a multilayered seed layer. The seed layer 203 thus comprises alternating layers of different materials, more specifically alternating layers of two metal materials M1 and M2, more specifically alternating monolayers of two metal materials M1 and M2.

According to some embodiments, the seed layer 203 can comprise alternating layers of more than two metal materials.

Still referring to FIG. 1, the multilayered structure of the seed layer 203 may also be referred to as a superlattice seed layer. As used herein, a superlattice refers to a structure having alternating layers of two or more materials where each of the layers has a thickness not exceeding a few nanometers. In the illustrated embodiment of FIG. 1, the seed layer 203 comprises a superlattice comprising alternating layers that have thicknesses less than about 0.3 nm, for example about 0.2 nm. Preferably the seed layer comprises a superlattice $(M1_{(t1)}/M2_{(t2)})_n$ of alternating monolayers of a first metal M1 with a thickness t1 and a second metal M2 with a thickness t2, where the sequence of metal M1/metal M2 is repeated n times. Thicknesses t1 and t2 are preferably less than about 0.3 nm. In some embodiments, the metal M1 is chosen from a group consisting of Ni, Co, CoFe, CoNi, and the metal M2 is chosen from a group consisting of Cr, Ru, CrRu, CoCr, Mo, and MoRu.

In some embodiments, the seed layer 203 comprises a superlattice with alternating monolayers of Ni and Cr.

It will be appreciated that by choosing a superlattice structure for the seed layer 203 according to embodiments disclosed herein, the perpendicular magnetic anisotropy (PMA) of the reference layer 204 may be maintained and even enhanced. In other words, the superlattice structure of the seed layer 203 strongly promotes PMA in the reference layer 204. Without being bound to any theory, the superlattice structure of the seed layer 203 can provide a texture and an interface that is suitable for the promotion of the PMA in the reference layer 204.

Still referring to FIG. 1, the magnetic element 2 further comprises a reference layer 204 on the seed layer 203; a tunnel barrier layer 205 on the reference layer 204; a storage layer 206 on the tunnel barrier layer 205; and a top electrode 207.

Figure 2:
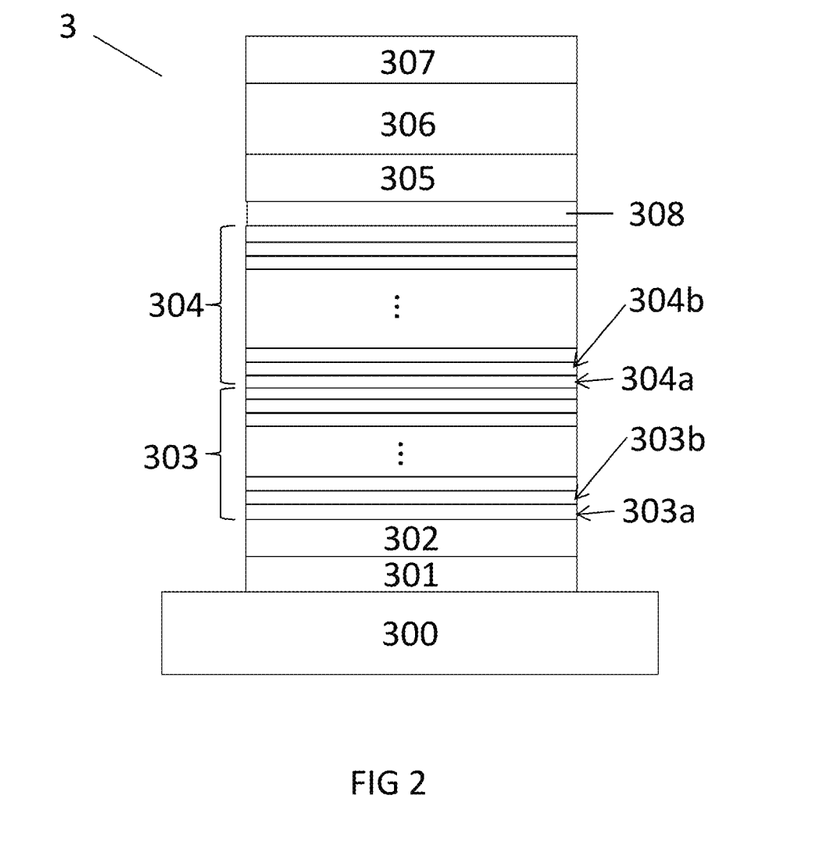

FIG. 2 illustrates a magnetic element 3 according to some other embodiments. The magnetic element 3 comprises a reference layer 304. In some embodiments, the reference layer 304 comprises a multilayered stack 304 including a first magnetic layer 304a and a second magnetic layer 304b, which can be a Ni-based magnetic layer. In some other embodiments, the reference layer 304 comprises multiple alternating layers of the magnetic layer 304a and the Ni-based magnetic layer 304b. In some embodiments, the first magnetic layer 304a can include a metal selected from a group consisting of Co, CoFe, CoNi, FeNi, and the second magnetic layer 304b it can include a Ni-based metal selected from Ni or NiFe. An example a multilayered stack of the reference layer 304 is (Co/Ni)n, where n refers to the number of repetition of the alternating first and second magnetic layers 304a and 304b, and can be chosen to have a value between n=2 to n=20. Each of the plurality of Co layers in the reference layer has a thickness from about 0.2 nm to about 0.5 nm and each of the plurality of Ni layers in the reference layer has a thickness from about 0.5 nm to about 1 nm.

According to embodiments, the reference layer 304 may further comprise a hard magnetic layer (also referred to as polarizer layer) 308 on the multilayered stack 304 such as for example a layer of CoFeB, CoFe, Fe or a combination thereof. The hard magnetic layer 308 is formed as an interface in between the multilayered stack 304 of the reference layer and the tunnel barrier layer 305.

According to some embodiments, the tunnel barrier layer (205 in FIGS. 1 and 305 in FIG. 2) is formed of or includes MgO. However, other embodiments are possible, where the tunnel barrier layer is formed or includes insulating tunnel barrier materials such as for example $AlO_x$, $TiO_x$, $ZnO_x$ $Al_xO_y$, $AlTiO_x$, $Mg_zTi_yO_x$, and $Mg_zAl_yO_x$, among other insulating tunnel barrier materials.

Different configurations of the magnetic layer and/or the tunnel barrier layer may be possible.

All of the layers in the magnetic element described herein may be formed in a sputter deposition system. Still referring to FIG. 2, the magnetic element 3 comprises, according to some embodiments: a substrate 300, for example a Si-substrate; a bottom electrode 301, for example a Ta or TaN or Ti or TiN-layer formed on the substrate 300; optionally an underlayer 302 formed on the bottom electrode 301 which can include, for example, a Ta-layer, a Hf-layer, a Ti-layer, a Cr layer, a Ru layer, a Cu layer, a Zr layer, or a V layer; a superlattice seed layer 303 with alternating monolayers of Ni 303a and Cr 303b formed on the bottom electrode 301 (or the underlayer 302 if present). In order to promote strong perpendicular magnetic anisotropy in the bilayers of Co/Ni (see below), a seed layer comprising a superlattice of Cr and Ni is formed, where a mono layer of Cr and a monolayer of Ni are repeated n number of times. The Cr and Ni thicknesses can each be about one monolayer (between about 0.2 nm and about 0.3 nm) and can be repeated n number of times, where n is between 2 and 20 (i.e., $2<=n<=20$).

The reference layer 304, formed on the superlattice seed layer 303, comprises a stack 304 of alternating layers of Co and Ni $(Co/Ni)_n$. The Co-layers may be only one monolayer with a thickness about 0.3 nm, the Ni-layers may be about two monolayers with the thickness of about 0.6 nm. The thickness of the Co-layer is preferably half of the thickness of the Ni-layer. In order to achieve perpendicular magnetic anisotropy, the layers are repeated between 2 and 20 times ($2<=n<=20$). The reference layer further comprises a magnetic layer 308 also referred to as a hard magnetic layer 308 (e.g., a CoFeB layer) on top of the multilayer stack. The hard CoFeB layer may be about 1.1 nm.

The magnetic element further comprises a tunnel barrier layer 305 of MgO on the CoFeB layer of the reference layer, a storage layer 306 of soft magnetic material, such as for example a CoFeB layer of about 1.3 nm, and a top electrode of 307 on top of the storage layer 30

Optionally a Ta-layer (insertion layer) is present in between the storage layer 306 and the top electrode 307 and has a thickness between 1 to 10 nm in order to provide a good interface for the CoFeB layer 306 below to promote PMA.

Figure 3:
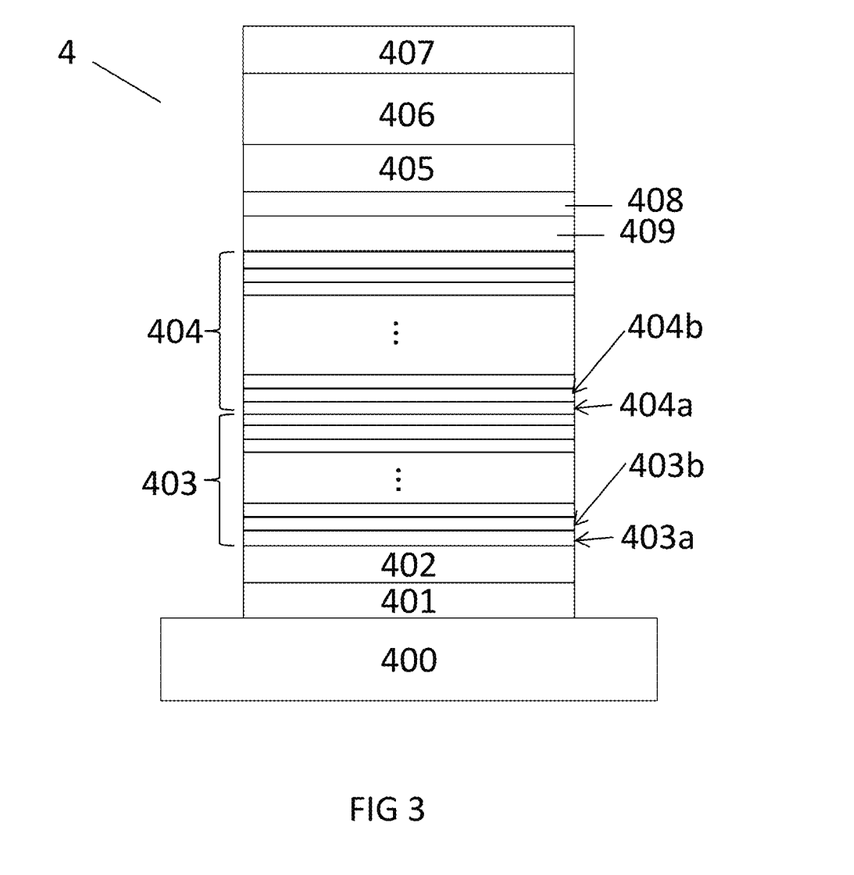

FIG. 3 illustrates a magnetic element 4 according to yet some other embodiments. The magnetic element 4 comprises similar elements as the magnetic element 3 described above with respect to FIG. 2 (reference numbers 401 are thus similar to 301, 402 to 302, ...) except that the magnetic element 4 includes an additional insertion layer 409 in order to reduce inter-layer diffusion. The insertion layer 409 may comprise Ta, TaN, Ru, Ti, TiN or Cr. The robust layer thickness can be varied between 0.2 nm and 1 nm while the magnetic layers are coupled to each other.

Furthermore, the insertion layer 409 may serve as a seed layer for a hard magnetic layer 408 (e.g. A CoFeB layer) adjacent to a tunnel barrier layer 405 (e.g., an MgO layer) to form the perpendicular polarizing layer with CoFeB thickness range between 0.7 nm to 1.5 nm. The insertion layer 409 serves to break the texture through the CoFeB polarizer layer, which arises from the Co/Ni bilayer multilayered stack. It will be appreciated that the insertion layer 409 is formed to have a sufficiently small thickness to provide sufficient magnetic coupling between the Co/Ni bilayers and the CoFeB layer.

Still referring to FIG. 3, according to some embodiments, the magnetic element 3 includes, according to embodiments, a stack comprising: a bottom electrode 401, an underlayer 402 comprising a Hf layer having about 6 nm on the bottom electrode 401 and a Ta layer of 2 nm on the Hf layer, a seed layer 403 comprising a superlattice (Ni~3.5 Å/Cr~3.5 Å) repeated n times, with n being 2, 4, 6, 8, 10 or 20, a reference layer 404 comprising a multilayer with a bilayer of (Co~3 Å/Ni~6 Å) repeated 10 times on the seed layer, an insertion layer 409 comprising a Ta layer of about 4 Å on the multilayer, and a hard magnetic layer 408 comprising a CoFeB layer of about 11 Å on the Ta layer, on the CoFeB layer of the reference layer a tunnel barrier layer 405 comprising a MgO layer of about 1 nm on the CoFeB layer, on the tunneling barrier layer a storage layer consisting of a CoFeB layer of 1.3 nm and a Ta layer of about 10 Å on the CoFeB layer and a top electrode on the Ta layer. Summarized the stack may be referred to as BE/Hf 6 nm/Ta 2 nm/(Ni~3.5 Å/Cr~3.5 Å)x/(Co~3 Å/Ni~6 Å)10/Ta~4 Å/CoFeB 11 Å/MgO 1 nm/CoFeB 13 Å/Ta 10 Å/Top Electrode.

Figure 4A:
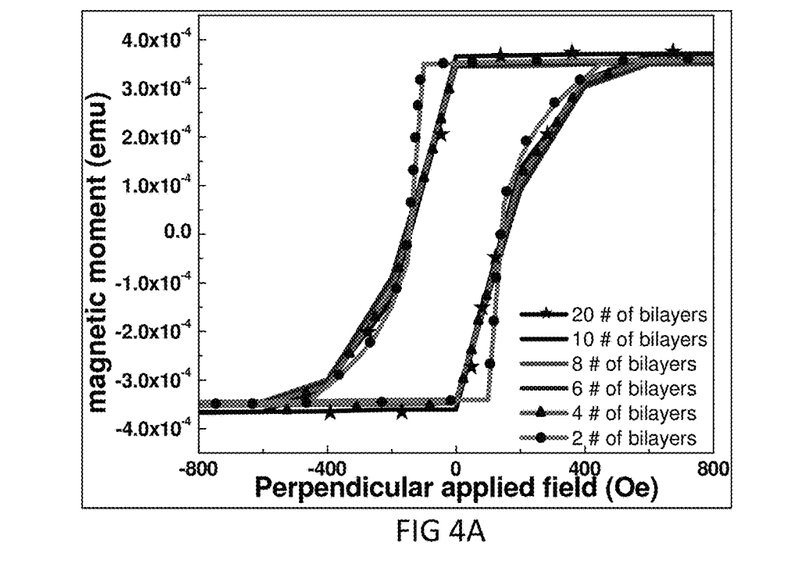
FIGS. 4A-4B, 5 and 6 show experimental results of a magnetic element according to embodiments of the present disclosure.
Figure 4B:
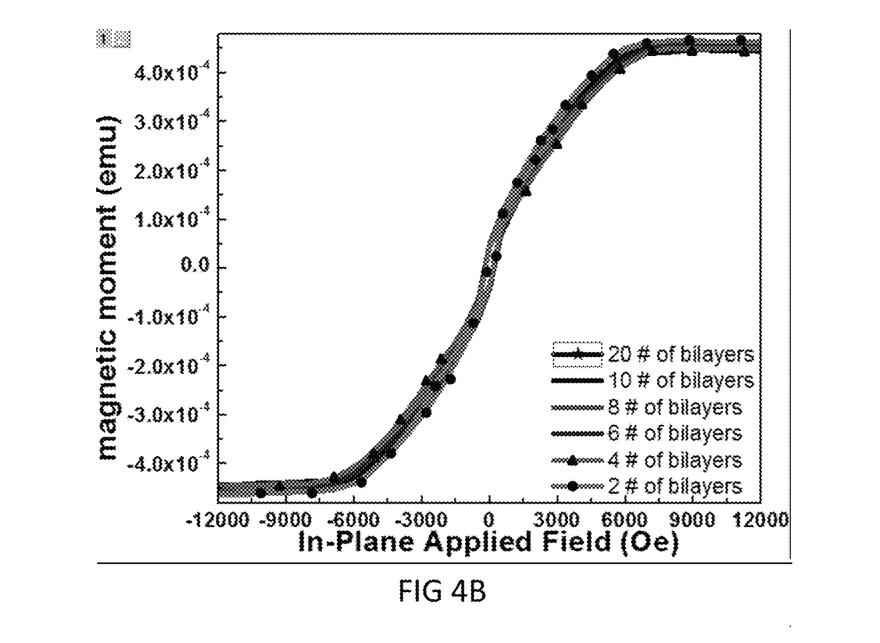

FIGS. 4A and 4B show experimental results of the Co/Ni magnetic hysteresis measurements. The (Co 3A/Ni 6A) 10 bilayers are deposited on Hf 6 nm/Ta 2 nm/(Ni 3.5 Å/Cr 3.5 Å)x with different Ni and Cr number of bilayers. The figures show magnetic moment (emu) measured as function of the applied magnetic field (perpendicular in FIG. 4A, in-plane in FIG. 4B) for this exemplary magnetic element. From FIG. 4B, this is noted that the degradation in magnetic anisotropy field for the reduced number of bilayer is not much. However, the sharper switching could be observed when 2 numbers of bilayers for Ni/Cr seed layer is used, while the magnetic switching is canted from out of plane direction when the number of Ni/Cr bilayers increase (x≥4) in FIG. 4A. Such strong magnetic field anisotropy together with sharp switching could be evident on the strong PMA of Co/Ni bilayers even when smaller number of bilayers in Ni/Cr superlattices is used. This small number of bilayers, makes such stack to be potential for reduced stack height and also roughness reduction due to seed layer thickness.

Figure 5:
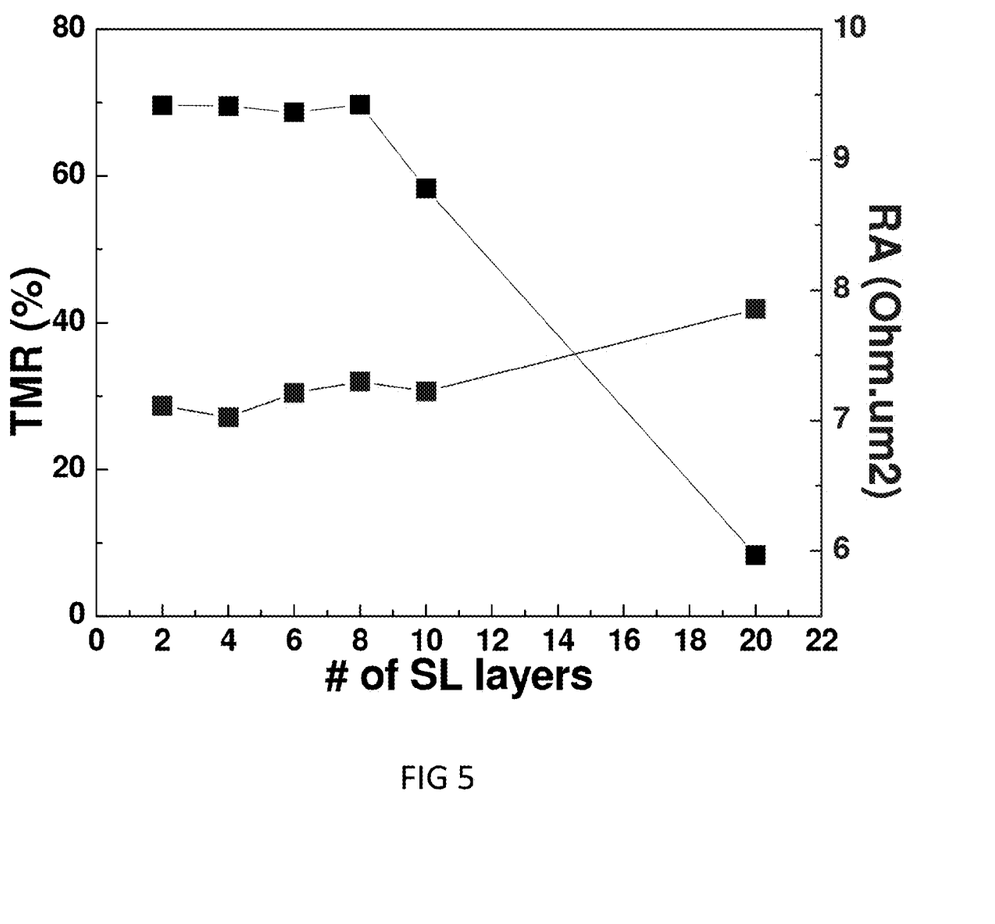

FIG. 5 illustrates experimental results for the tunnel magnetoresistance signal (TMR) as a function of number of Ni/Cr superlattice repeats n after annealing the MTJ stack at 300 degrees Celsius during 30 minutes. The TMR drops for n=10 and n=20 repeats in Ni/Cr bilayers.

Figure 6:
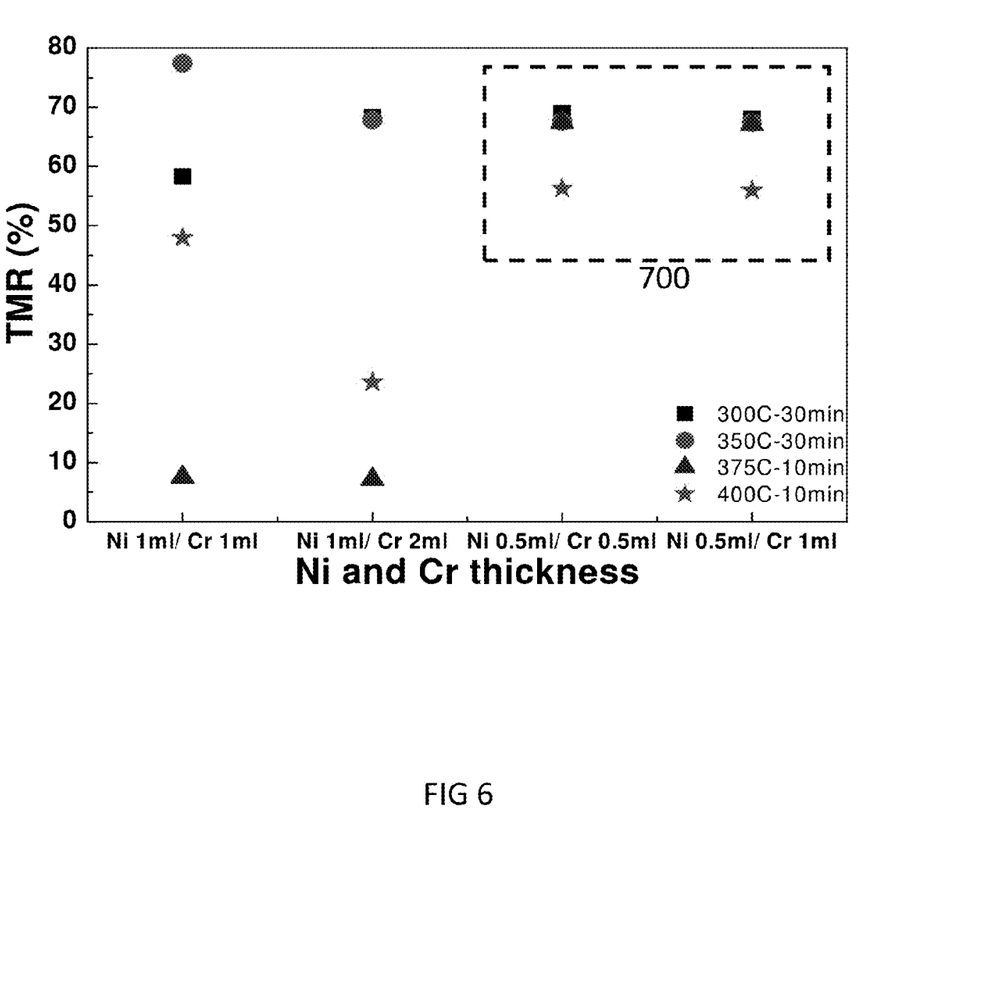

FIG. 6 illustrates experimental results for the tunnel magnetoresistance signal (TMR) as a function of the thickness of Ni an Cr layers of the Ni/Cr superlattice after different annealing steps with different annealing parameters (temperature and time). The complete STTMRAM stack is BE (bottom electrode)/Hf 6 nm/Ta 2 nm/($Ni_x$/$Cr_y$)10/(Co 3 Å/Ni 6 Å)10/Ta 4 Å/CoFeB 11 Å/MgO 1 nm/CoFeB 13 Å/Ta 10 Å/TE (top electrode). In box 700 best results (high TMR) are achieved for the layers with smallest thickness. The thickness of the Ni and/or Cr layers is about 1.75 Å which equals about a half monolayer (0.5 ml). 1 monolayer (ml) is about 3.5 Å.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

What is claimed is:

1. A magnetic element comprising:
a substrate;
a metal underlayer formed over the substrate; and
a seed layer on the underlayer, the seed layer comprising alternating layers of a first metal and a second metal, wherein each of the first metal and the second metal is formed of a different metal from the metal underlayer.

2. The magnetic element according to claim 1, wherein the alternating layers of the first metal and the second metal are repeated n times, wherein 2≤n≤20.

3. The magnetic element according to claim 1, wherein each layer of the alternating layers has a thickness less than about 0.3 nm.

4. The magnetic element according to claim 1, wherein the alternating layers form a superlattice structure.

5. The magnetic element according to claim 1, wherein the alternating layers comprise alternating monolayers of the first metal and the second metal.

6. The magnetic element according to claim 5, wherein the monolayers of the first metal and the second metal are monolayers of Ni and Cr.

7. The magnetic element according to claim 1, wherein the metal underlayer comprises a metal chosen from the group consisting of Hf, Ta and Ti.

8. The magnetic element according to claim 1, further comprising a reference layer on the seed layer, a tunnel barrier layer on the reference layer and a storage layer on the tunnel barrier layer.

9. The magnetic element according to claim 1, further comprising a reference layer formed on the alternating layers of the seed layer, wherein the seed layer forms an interface with the reference layer which has a texture that is different from an interface formed between the reference layer and a seed layer that does not have an alternating structure, such that the seed layer promotes a stronger perpendicular magnetic anisotropy of the reference layer compared to a seed layer that does not have the alternating structure.

10. The magnetic element according to claim 8, wherein the reference layer comprises a multilayered stack of alternating metal layers on the seed layer and a polarizer layer on the multilayered stack.

11. The magnetic element according to claim 10, wherein the multilayered stack of alternating metal layers of the reference layer comprises alternating layers of Co and Ni.

12. The magnetic element according to claim 8, wherein the reference layer further comprises an insertion layer in between the multilayered stack and the polarizer layer.

13. The magnetic element according to claim 12, wherein the insertion layer comprises a material chosen from the group consisting of Ta, TaN, Ti, Hf, and FeTa.

14. A spin transfer torque magnetic random access memory element having a perpendicular magnetic orientation, comprising:

a metal underlayer on a substrate, a seed layer on the metal underlayer, wherein the seed layer comprises alternating layers of a first metal and a second metal; and a magnetic tunnel junction (MTJ) element with a perpendicular orientation including: a reference layer formed on the seed layer, a tunnel barrier layer formed on the reference layer, a storage layer formed on the tunnel barrier layer and a top electrode and a bottom electrode.

15. The spin transfer torque magnetic random access memory element according to claim 14, wherein the substrate is a Si-based substrate, wherein the metal underlayer comprises Hf, Ta or Ti, wherein the seed layer comprises one of alternating monolayers of Ni and Cr or a multilayered stack of alternating layers of Ni and Co, wherein the insertion layer comprises a material chosen from the group consisting of Ta, TaN, Ti, Hf or FeTa, wherein the polarizer layer comprises CoFeB, wherein the tunnel barrier layer comprises MgO, and wherein the storage layer comprises CoFeB.

* * * * *